Figure 1:
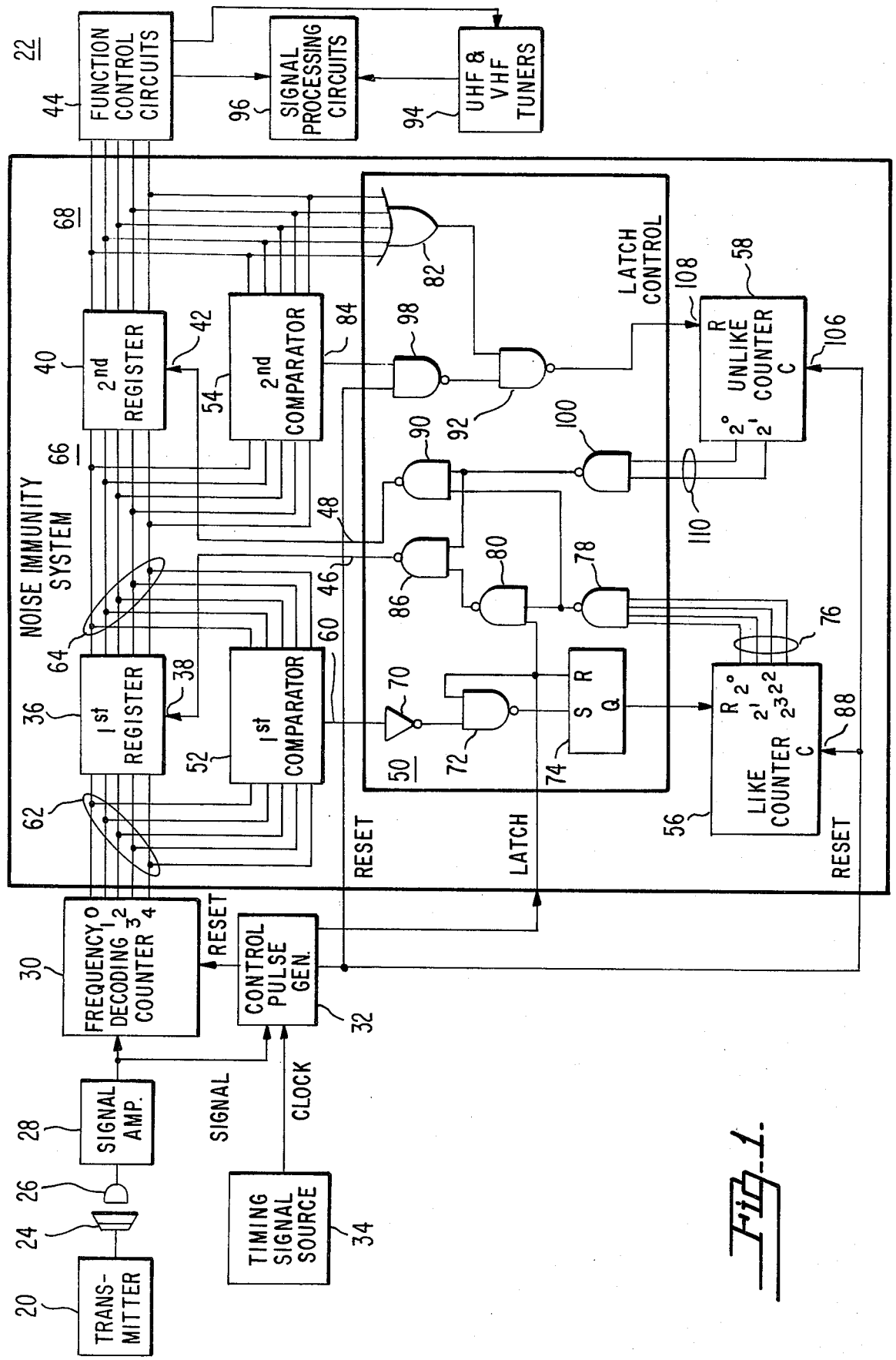

United States Patent [19]

Woolling, Jr.

[11] 3,980,956

[45] Sept. 14, 1976

[54] COUNTER TYPE REMOTE CONTROL RECEIVER INCLUDING NOISE IMMUNITY SYSTEM

[75] Inventor: Kenneth Rau Woolling, Jr., Indianapolis, Ind.

[73] Assignee: RCA Corporation, New York, N.Y.

[22] Filed: Aug. 25, 1975

[21] Appl. No.: 607,700

[52] U.S. Cl. ............................... 325/391; 325/392; 340/171 A; 178/DIG. 15
[51] Int. Cl.² ......................................... H04B 1/06
[58] Field of Search .................. 325/390, 391, 392; 340/168 R, 168 B, 168 C, 168 CC, 146.1 BA, 171 R, 171 A; 178/DIG. 15

[56] References Cited
UNITED STATES PATENTS

| | | | |
|---|---|---|---|
| 3,621,487 | 11/1971 | Christensen | 340/168 C |
| 3,678,392 | 7/1972 | Houghton | 178/DIG. 15 |
| 3,919,690 | 11/1975 | Field | 340/146.1 BA |

*Primary Examiner*—Robert L. Griffin
*Assistant Examiner*—Michael A. Masinick
*Attorney, Agent, or Firm*—Eugene M. Whitacre; Kenneth R. Schaefer; Peter M. Emanuel

[57] ABSTRACT

A remote control receiver for processing signals representative of a plurality of commands, each command being identified by a control signal lying in a respective band of frequencies. The command-representative control signals are supplied to a counter which is also supplied with regularly recurring timing or clock signals. The clock signals provide recurring counting intervals of fixed duration during which the frequency of an incoming signal is measured and divided. The counter provides an output count, the magnitude of which is representative of a particular command. The divided output signals are compared during successive time intervals for identifying continued reception of like signals. Apparatus which is to be controlled by the received command signals is supplied with the divided output signals only after a predetermined number of successive like output signals are sensed. When successive output signals deviate from each other in a particular manner, they are decoupled from the control apparatus to prevent erroneous responses.

8 Claims, 2 Drawing Figures

COUNTER TYPE REMOTE CONTROL RECEIVER INCLUDING NOISE IMMUNITY SYSTEM

This invention relates to remote control receivers employing frequency counting apparatus for identification of received commands and, more particularly, to remote control receivers of the digital type including a noise immunity system.

Ultrasonic remote control systems are known in which a plurality of continuous wave (c.w.) signals are generated, the frequency of each signal being uniquely associated with a different function to be controlled. These systems have been employed, for example, in color television receivers where functions such as color, tint, volume and channel selection are to be controlled. In that environment, it has been customary to employ inductance-capacitance tuned circuits to separate and identify the individual command frequencies. Such systems require individual alignment of the tuned circuits and are significantly limited in the selectivity which may be realized at reasonable cost. Recently, remote control receivers have been proposed which employ digital techniques to count the cycles of ultrasonic signal received during a predetermined timing period or "window" and thereby identify the transmitted frequency and the function to be controlled. Some degree of erroneous signal (noise) immunity is accomplished in such systems by analog or digital filtering of the signal prior to its being counted (see, for example, Funkschau, Vol. 23/24, 1972, "Ein Farbfernehgerat ohne Bedienungsknopfe," by B. Viereck, P. Wahl and H. Leuschner).

In the case of functions such as volume, tint or color, incremental changes in these parameters in response to a command may be arranged to be sufficiently small so that an occasional erroneous response of interruption in a command readily may be tolerated by a viewer. However, in the case of channel selection, errors of a single increment in response can result in an undesired channel (station) being selected. Furthermore, if each digit of a channel number command is represented by a unique frequency (i.e., direct address of channels as contrasted to "scanning" for channel selection), a momentary interruption of transmission of a command may be interpreted as the end of transmission of one digit of the channel command and the beginning of transmission of a second digit. For example, momentary interruption of transmission of a frequency corresponding to a digit 2 command may be interpreted by the system as a 22 command, thus resulting in a disparity between a desired channel and that which is displayed by the receiver. These and other spurious signal problems associated with ultrasonic remote control systems, such as multipath reception, telephone ringing, key jangling, etc., require consideration in the design of a practical remote control system for home use.

In accordance with the present invention, a remote control receiver is employed for processing signals representative of a plurality of commands. Each command is identified by control signals lying in a respective band of frequencies. Means are provided for supplying timing reference signals recurring at predetermined time intervals. Counter means are responsive to the timing reference signals and to the control signals for providing output signals representative of a command. Means are provided for comparing successive one of the output signals and for identifying continued reception of like signals in successive time intervals. Control means are also provided which responsive to the output signals for executing the commands. Switching means are coupled to the comparing means for coupling output signals to the control means only after a predetermined number of like output signals have been sensed and for decoupling the output signals from the control means when the output signals deviate in a predetermined manner from the like output signals.

Figure 2:
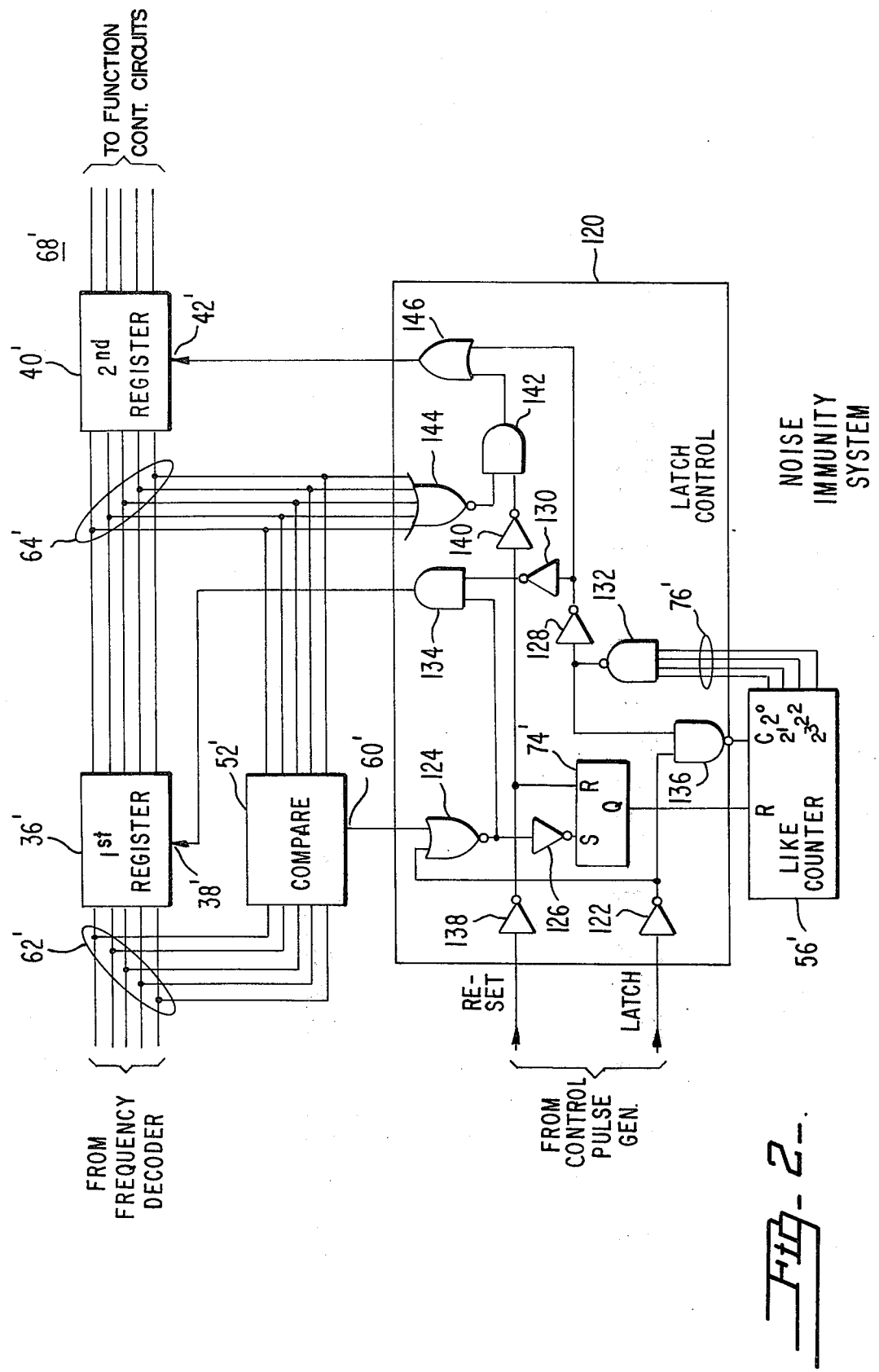

The invention will be further understood from the following description when considered in conjunction with the accompanying drawings in which:

FIG. 1 is a block diagram of a remote control receiver including noise immunity arrangement embodying the invention and suitable for use in a television receiver; and FIG. 2 is a diagram of a second noise immunity arrangement embodying the invention which is suitable for use in the general system of FIG. 1.

In the system of FIG. 1, the operator of a multi-frequency c.w. ultrasonic transmitter 20 selects a frequency to be transmitted which corresponds to a function to be controlled in an associated television receiver 22. Typical frequencies may be in the range of 25,000 to 50,000 Hertz and may be spaced within this band at intervals of, for example, 1080 Hertz. A frequency is selected, for example, by actuating a push button labelled with the appropriate function (volume "up"). Ultrasonic waves are generated at a transmitter transducer 24 and are received by a receiver transducer 26. The received waves are converted to electrical signals which, in turn, are coupled via a signal amplifier 28 to a counter-type frequency decoder 30 which is arranged to provide an effective frequency division of the incoming signals by, for example, a factor of nine. Counter system 30 is also supplied from a timing signal source 34 with clock or timing pulses at a regular rate (e.g., 50 or 60 Hertz derived from an A.C. power line or a crystal reference) and provides binary outputs on five lines 62 representative of the frequency of the received signal. Frequency decoder 30 is reset to all zero outputs prior to the beginning of each counting interval by means of RESET pulses supplied from a control pulse generator 32. The frequency divided data provided on lines 62 at the end of each counting interval is coupled to a first register 36 having like pluralities of input and output terminals (e.g., 5) and a plurality of internal "latch" circuits. These latch circuits operate to transfer information present at the input terminals of register 36 to the output terminals thereof in response to a clocking (latch) input supplied to a latch input terminal 38 as will be explained below. Such latch circuits may, for example, be of the CD4042 type marketed by RCA Corporation.

Output data provided by register 36 is coupled via a plurality of lines 64 to a corresponding number of input data terminals of a second register 40, which, for example, may be identical to register 36. Register 40 also includes a latch input terminal 42 for controlling transfer of data present at input lines 66 to output lines 68 as will be explained below.

Data output terminals of register 40 are coupled via the lines 68 to appropriate decoding and/or control circuits 44 within television receiver 22. The control circuits 44 are arranged to translate supplied digital data to signals suitable for controlling analog and/or digital functions (color, tint, volume, channel).

Transfer of data into first register 36, between registers 36 and 40 and from register 40 to the control circuits 44 is effected according to individual clocking or latch control signals supplied to terminals 38 and 42 from respective outputs 46, 48 of a latch control assembly 50.

Latch control assembly 50 operates in conjunction with first and second comparators 52, 54, a "like"-counter 56 and an "unlike"counter 58 to measure the reliability of the information supplied by frequency decoding counter 30 and, based upon such reliability, to either couple data to the control circuits 44 or to uncouple such data. To this end, the first comparator 52 includes two sets of input terminals coupled, respectively, to the data input and output terminals of register 36 to compare incoming data with previously stored data. Similarly, second comparator 54 includes two sets of input terminals coupled, respectively, to data input and output terminals of register 40. "Compare" or "non-compare" output indications are coupled from an output terminal 60 of comparator 52 and from an output terminal 84 of comparator 54 to latch control assembly 50. In addition, output data lines 68 of second register 40 are coupled to a first input OR circuit 82 within latch control assembly 50 to provide an indication when control information is being supplied to function control circuits 44. The logic arrangement of the remaining components within latch control assembly 50 may best be understood in the context of a typical operating sequence.

Prior to reception of ultrasonic signals by transducer 26, timing signal source 34 operates to produce clock pulses spaced, for example, 1/120th second apart. Each of these clock pulses is processed by control pulse generator 32 to provide a relatively short duration "latch" pulse followed by a similarly short duration "reset" pulse (for example, in the range of 20 to 40 microseconds in length). Each reset pulse causes the output lines 62 from counter frequency decoder 30 all to be returned to zero. When no signals are received, this zero data will be propagated through to data lines 64 and 68 in the manner to be described below.

During a following interval between reset pulses, any data signal (i.e., a continuous wave ultrasonic signal) received at transducer 26 is coupled to counterfrequency decoder 30 where its frequency is divided, for example, by a factor of nine. This frequency division provides a form of electronic filtering of the signal which aids in diminishing the effect of noise pulses on the output of decoder 30. The frequency divided output of decoder 30 appears at lines 62 and is compared, data line by data line, in first comparator 52 with the information present on output lines 64. Since the signal being processed is newly received, lines 62 and 64 will indicate different data conditions (lines 64 typically will be all zeroes) and comparator 52 will produce a "non-compare" response (e.g., a logic zero) at terminal 60. The non-compare response is inverted by an inverting amplifier 70 and the resultant signal (logic 1) is applied to one input terminal of a NAND gate 72. Just prior to the end of the counting interval (i.e., prior to the next reset pulse), a "latch" pulse is supplied from control pulse generator 32 to a second input of NAND gate 72. NAND gate 72 responds and couples a "set" pulse to a set terminal of an RS bistable circuit 74. The set pulse causes a change in state at the output (Q) terminal of circuit 74 (zero to one), thereby causing a reset pulse to be coupled to a reset (R) terminal of like counter 56. All of the output data lines 76 ($2^0 - 2^3$) of like counter 56 will be reset to zero, thereby indicating the fact that an "unlike" data input has been supplied to first register 36. It should also be noted that bistable circuit 74 responds to the level of the latch pulse following its trailing edge and bistable circuit 74 is thereby reset to zero output at the Q terminal. Like counter 56 is then prepared to count reset pulses supplied to a count (C) terminal 88.

A NAND gate 78 coupled to the lines 76 provides a logic 1 signal to a NAND gate 80 which is also supplied with latch pulses from pulse generator 32. The latch pulses are inverted by NAND gate 80 and again by NAND gate 86. As will be explained below, latch pulses are inverted by NAND gate 86 at this time be virtue of the fact that unlike counter 58 is in a zero output condition and therefore a second input of NAND gate 86 is provided with a logic 1 input via a NAND gate 100. A resulting latch pulse supplied to latch terminal 38 of first register 36 causes the data at input lines 62 to be stored in register 36 and to appear at output lines 64 just prior to the time that the following reset pulse again returns the counter-frequency decoder 30 and the lines 62 to an all zero condition.

The newly received data stored in first register 36 is not, however, transferred to function control circuits 44 at this time. Its transfer is blocked by second register 40, the latch terminal 42 of which is maintained at zero unit an appropriate latching pulse is supplied to terminal 42 via a NAND gate 90. Such a latching pulse (a transition from 0 to 1 and back to 0) is not provided until like counter 56 records the appearance at data lines 62 of identical data during a predetermined number of (e.g., sixteen) consecutive data periods. At that time, all of the output lines 76 of like counter 56 will indicate ones's, the output of NAND gate 78 will change to zero and a transition to a one logic condition will appear at latch terminal 42. The information at the data lines 66 will then appear at the data lines 68 and will be coupled to function control circuits 44. When the next reset pulse is applied to count terminal 88 of like counter 56, all of its output lines 76 will advance to zero, thereby coupling a "one"to NAND gate 90. The latch signal applied to terminal 42 of second register 40 will return to zero. At that time, the data previously supplied to second register 40 on data lines 66 will be stored and will continue to appear on data lines 68 until unlike counter 58 records reception of a predetermined number of (e.g., three) subsequent counts unlike that stored in register 40. This latter condition can occur either as the result of termination of transmission, a desired change in the data transmitted or reception of interfering noise. It should be noted that, if the first comparator 52 indicates reception of unlike data at any time prior to reception during sixteen consecutive intervals of like data, like counter 56 will be reset to zero via bistable circuit 74 and the "like" counting will begin over again. However, once like counter 56 has caused data to be latched into second register 40, such data will remain until the three unlike counts are recorded by unlike counter 58.

Unlike counts are recorded by counter 58 in the following manner. Second comparator 58 operates, subsequent to the occurrence of the above-identified sixteen like counts, to compare the data transferred to output lines 68 with data latched into first register 36 during each subsequent counting interval. If second comparator 54 produces a "compare" (one) output, inverted reset pulses coupled to a second input of a NAND gate 98 are again inverted and the resultant signal (zero) is applied to one input of a NAND gate 92. A second input of NAND gate 92 is supplied by OR gate 82 which provides a 1 output when any of the data lines 68 is at a 1 state. That is, a 1 output from OR gate 82 indicates the presence of control data at the output lines 68. The NAND gate 92 therefore again inverts the reset information supplied at its input and supplies a reset pulse to a reset terminal 108 of unlike counter 58 to reset output lines 110 to zero. NAND gate 100 therefore provides a 1 input to one gate of NAND circuit 90 as was mentioned above in connection with the operation of like counter 56. The latch input 42 of second register 40 will therefore remain at zero and no information transfer will take place through second register 40.

When a non-compare (zero) output is produced from second comparator 54, no reset pulse is supplied to reset terminal 108 of unlike counter 58. Unlike counter 58 therefore responds to inverted reset pulses supplied to a count terminal 106 and accumulates an unlike count for each such non-compare output of comparator 54. The data lines 110 at the output of unlike counter 58 indicate the accumulation of unlike counts and when three such unlike counts occur, the output of NAND gate 100 will change to a zero state at the time of the occurrence of the reset pulse. This condition will cause the outputs of each of NAND gates 86 and 90 to change to a one state, thereby causing registers 36 and 40 to switch entirely to zero states (lines 62 will be reset to zero at this time). New data may then be entered into first register 36 during the next counting interval and, after sixteen like counts have been sensed, such data may be transferred to function control circuits 44 in the manner described above.

A second embodiment of a noise immunity system constructed in accordance with the present invention is shown in FIG. 2, wherein components which perform functions similar to those shown in FIG. 1 are indicated by the same reference numeral as used in FIG. 1 followed by a prime (') symbol. In FIG. 2, data is provided to data lines 62' from frequency decoder 30 or a similar device. Latch pulses followed by inverted reset pulses are produced, for example, by a control pulse generator 32' as was described with respect to FIG. 1. Also, data produced at data lines 68' is coupled to function control circuits such as the circuits such as the circuits 44 of FIG. 1 and produces similar changes in the television chassis 22 as was described with respect to FIG. 1.

As can be noted from FIG. 2, no unlike counter and no second comparator are employed in the noise immunity system of FIG. 2. In addition, a latch control 120 of FIG. 2 is substantially modified as compared to the latch control of FIG. 1.

In the system of FIG. 2, when no data has been received at transducer 26 for one or more counting intervals, all of the data lines 62', 64', 68' will indicate zeroes. When transmitter 20 is activated to transmit a particular ultrasonic frequency, the frequency decoding counter 30 will begin to accumulate data at the data lines 62' indicative of the received frequency. At the end of a first counting period (as defined by the beginning of a latch pulse provided by control pulse generator 32), a "non-compare" (zero) output will be coupled from an output terminal 60' of 52' to one input of a NOR gate 124. A latch pulse supplied by generator 32 will be appropriately inverted and coupled via, in sequence, an inverting amplifier 122, NOR gate 124, a second inverting amplifier 126, and an RS bistable (latch) circuit 74' to a reset (R) terminal of like counter 56'. All of the data lines 76' of like counter 56' will then be reset to zero. The state of like counter 56' (as indicated by output lines 76') is sensed at a NAND gate 132. The all zero output state of lines 76'is transmitted via inverting amplifiers 128 and 130 to one input of an AND gate 134. AND gate 134 responds to the combination of the zero like count output of inverter 130 and an appropriately inverted latch output supplied via inverter 122 and NOR gate 124 to couple a "transfer"(logic 1) signal to latch input terminal 38' of first register 36'. The data at input lines 62' is therefore transferred to the output lines 64'. At the end of the latch pulse, the signal applied to latch input terminal 38'will return to zero, thereby storing the received data at terminals 64'. No data will be transferred through second register 40' until like counter 56' records 15 consecutive compare outputs from comparator 52'. These comparisons (or reception of like counts) are recorded in the following manner.

At the end of a second data counting interval, a latch pulse supplied by pulse generator 32 is inverted by inverter 122 and a resulting level change (1 to 0) is applied to one input of NOR gate 124. If the information present on input data lines 62' (the second count) is identical line for line with that stored at the output data lines 64' (the first count) comparator 52' will provide a compare (logic 1) output to the second terminal or NOR gate 124. The resultant output of NOR gate 124 (a zero) will be coupled to one input of AND gate 134, the second input to which is indicative of the output count of like counter 56'. It should be noted that whenever the output lines 76' of like counter 56' indicate a number less than fifteen, the output of inverter 130 will be at a logic 1 state. It can therefore be seen that the latch input terminal 38' of first register 36' will be "disabled" or in a zero state. The data received in the second counting interval (which was identical to that recorded during the first counting interval) is therefore not transferred to output data lines 64' but rather the previously received identical data is maintained.

The latch pulse supplied via inverter 122 is, however, coupled to a second input terminal of a NAND gate 136, the first input terminal of which is supplied from the output of NAND gate 132. The count of like counter 96 will advance when (1) the output count of like counter 56'is less than 15, (2) and the output of comparator 52'indicates a compare so that no reset pulse is applied to like counter 56' and (3) an appropriately inverted latch pulse applied to the count (C) terminal changes from a logic 1 to a logic 0 state.

When like counter 56' reaches a count of fifteen, all of the data lines 76' will be at 1 logic states. NAND gate 136 will then couple a constant logic 1 to the count (C) terminal of like counter 56' and inhibit the accumulation of further counts therein. In addition, an inverter 128 and an OR gate 146 serve to couple a transfer (1) signal to latch input terminal 42' of second register 40'. The data present at data lines 64' is thereupon transferred via second register 40' and data lines 68'to function control circuits 44 (FIG. 1).

If, during any subsequent counting interval, data present at data lines 62' is different from the data present at data lines 64', a non-compare output from comparator 52' is coupled to one input of NOR gate 124.

The next latch pulse supplied via inverter 122 causes RS bistable circuit 74' to provide a reset pulse to the reset (R) terminal of like counter 56'. All of the data lines 76' at the output of counter 56' will thereupon be reset to zero.

Latch input terminal 38' of first register 36' will also be supplied with a transfer (1) input, causing the new data to be transferred to data lines 64'. If the data coupled to data lines 62' is all zeroes (indicating an end of transmission), a NOR gate 144 will provide a logic 1 to one input of an AND gate 142. The next reset pulse coupled via inverters 138 and 140 to a second input of AND gate 142 will produce a logic 1 at a second input of OR gate 146, enabling the latch terminal 42' of second register 40'. The all zeroes data on lines 62' will thereupon be coupled through to data lines 68' and function control circuits 44. If the received data is other than all zeroes, it will be coupled to lines 68' when like counter 56' again records 15 consecutive like comparisons.

The systems of FIGS. 1 and 2 are shown with like counters arranged for 15 consecutive intervals of like data to be produced at input data lines before coupling data to the function control circuits 44. The system of FIG. 1 is also arranged for reception of 3 intervals of unlike data to be received before the accepted data is decoupled from the control circuits 44. It should be understood that other numbers of intervals of like and unlike data may be chosen to accommodate different operational requirements. The criteria for selection of the number of like counts is based on the anticipated duration of the production of interfering signals in the environment. The criteria for selection of the number of unlike counts is based on the anticipated duration of received signal drop-out which may be tolerated. It should also be noted that other timing signal source pulse rates may be selected to accommodate the received signal frequencies and the desired separation of frequencies. Additional modifications may also be made to the described systems without departing from the contemplated invention.

Apparatus suitable for use in the illustrated configurations may be assembled utilizing the following component types:

| RS Bistable Circuits | RCA Type CD4044 |
| Registers | RCA Type CD4042 |
| Comparators | RCA Type CD4030 |

Standard logic gates may be employed for the various AND, NAND, NOR, OR and inverter functions.

What is claimed is:

1. In a remote control receiver for processing signals representative of a plurality of commands, each command being identified by control signals lying in a respective band of frequencies, the combination comprising:

means for supplying timing reference signals recurring at predetermined time intervals;
counter means responsive to said timing reference signals and to said control signals for providing output signals representative of a command;
means for comparing successive ones of said output signals and for identifying continued reception of like signals in successive time intervals;
control means responsive to said output signals for executing said commands; and
switching means coupled to said comparing means for coupling said output signals to said control means only after a first predetermined number of like output signals have been sensed and for decoupling said output signals from said control means when said output signals deviate in a predetermined manner from said like output signals.

2. In a remote control receiver, the combination according to claim 1 wherein:
said switching means couples said output signals to said control means only after like output signals have been sensed during said first predetermined number of consecutive ones of said time intervals and for decoupling said output signals from said control means when a second predetermined number of unlike output signals are sensed.

3. In a remote control receiver, the combination according to claim 2 wherein:
said first predetermined number is greater than said second predetermined number.

4. In a remote control receiver, the combination according to claim 2 wherein:
said timing signals recur at equal time intervals; and
said counter means comprises frequency dividing means for providing binary output signals lower in numerical value than the frequencies of said respective control signals divided by said time intervals.

5. In a remote control receiver, the combination according to claim 4 wherein:
said means for comparing successive output signals comprises at least a first binary data storage register having pluralities of input and output data lines, said input data lines being coupled to said counter means for receiving said binary output signals, said comparing means further comprising a comparator coupled to said input and output data lines for providing a first control output when line by line said input data lines indicate like data as compared to said output lines and for providing a second control output when line by line said input data lines indicate unlike data as compared to said output lines.

6. In a remote control receiver, the combination according to claim 5 wherein:
said first binary data storage register is responsive to said first control output for storing at said output data lines data present at said input data lines.

7. In a remote control receiver, the combination according to claim 6 wherein:
said switching means comprises at least a first counter for recording the number of consecutive time intervals in which said first control output is produced.

8. In a remote control receiver, the combination according to claim 7 wherein:
said switching means comprises a second counter for recording the number of time intervals in which said second control output is produced subsequent to sensing of said first predetermined number of like output signals.

* * * * *

UNITED STATES PATENT OFFICE
CERTIFICATE OF CORRECTION

PATENT NO. : 3,980,956

DATED : September 14, 1976

INVENTOR(S) : Kenneth Rau Woolling, Jr.

It is certified that error appears in the above-identified patent and that said Letters Patent are hereby corrected as shown below:

Column 4, line 15, that portion reading "be" should read "by"; Column 4, line 29, that portion reading "unit" should read -- until --.

Signed and Sealed this

Fourteenth Day of December 1976

[SEAL]

Attest:

RUTH C. MASON
Attesting Officer

C. MARSHALL DANN
Commissioner of Patents and Trademarks

Disclaimer 3,980,956.—*Kenneth R. Woolling, Jr.*, Indianapolis, Ind. COUNTER TYPE REMOTE CONTROL RECEIVER INCLUDING NOISE IMMUNITY SYSTEM. Patent dated Sept. 14, 1976. Disclaimer filed Feb. 21, 1984, by the assignee, *RCA Corp.*

Hereby enters this disclaimer to claims 1 through 5 of said patent.

[*Official Gazette April 17, 1984.*]